(12) United States Patent
Xia et al.

(10) Patent No.: US 12,453,257 B2
(45) Date of Patent: Oct. 21, 2025

(54) DISPLAY SUBSTRATE, PREPARATION METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Wei Xia, Beijing (CN); Tao Gao, Beijing (CN); Yuanzheng Guo, Beijing (CN); Huaisen Ren, Beijing (CN); Jie Li, Beijing (CN); Yongzhan Han, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 786 days.

(21) Appl. No.: 17/789,518

(22) PCT Filed: Aug. 10, 2021

(86) PCT No.: PCT/CN2021/111729
§ 371 (c)(1),
(2) Date: Jun. 28, 2022

(87) PCT Pub. No.: WO2022/062740
PCT Pub. Date: Mar. 31, 2022

(65) Prior Publication Data
US 2023/0040064 A1    Feb. 9, 2023

(30) Foreign Application Priority Data

Sep. 25, 2020    (CN) .................... 202011020687.7

(51) Int. Cl.
*H10K 59/131*    (2023.01)
*H01L 23/00*    (2006.01)
(Continued)

(52) U.S. Cl.
CPC .......... *H10K 59/131* (2023.02); *H01L 24/03* (2013.01); *H01L 24/05* (2013.01); *H01L 24/32* (2013.01);
(Continued)

(58) Field of Classification Search
CPC .... H10K 59/131; H10K 59/124; H10K 71/00; H10K 59/1201; H01L 24/03;
(Continued)

(56) References Cited

U.S. PATENT DOCUMENTS

2021/0359050 A1* 11/2021 Yang .................. H10K 50/81
2022/0310010 A1    9/2022 Cheng et al.

FOREIGN PATENT DOCUMENTS

CN    109616480 A    4/2019
CN    109638049 A    4/2019
(Continued)

OTHER PUBLICATIONS

International Search Report for PCT/CN2021/111729 Mailed Nov. 16, 2021.

*Primary Examiner* — Britt D Hanley
*Assistant Examiner* — Victor V Barzykin
(74) *Attorney, Agent, or Firm* — Ling Wu; Stephen Yang; Ling and Yang Intellectual Property

(57) ABSTRACT

Disclosed are a display substrate, a preparation method therefor, and a display device. The display substrate includes a display region and a binding region on one side of the display region. The binding region includes a binding structure layer disposed on a base. The binding structure layer includes a composite insulating layer disposed on the base.

(Continued)

The binding region further includes a step structure formed by the base and the composite insulating layer. Heights of steps in the step structure decrease sequentially in the direction away from the display region. In the step structure, the base forms a first step having the smallest height. The binding structure layer further includes a signal connection wire having at least a portion thereof disposed on the step structure and located on the first step. An opening exposing the signal connection wire is provided on the base at the first step.

16 Claims, 8 Drawing Sheets

(51) Int. Cl.
  *H01L 25/16* (2023.01)
  *H01L 25/18* (2023.01)
  *H10K 59/124* (2023.01)
  *H10K 71/00* (2023.01)
  *H05K 1/18* (2006.01)
  *H05K 3/34* (2006.01)
  *H10K 59/12* (2023.01)
  *H10K 59/121* (2023.01)
  *H10K 71/80* (2023.01)

(52) U.S. Cl.
  CPC ............ *H01L 25/167* (2013.01); *H01L 25/18* (2013.01); *H10K 59/124* (2023.02); *H10K 71/00* (2023.02); *H01L 2224/03002* (2013.01); *H01L 2224/05558* (2013.01); *H01L 2224/05573* (2013.01); *H05K 1/181* (2013.01); *H05K 3/3426* (2013.01); *H10K 59/1201* (2023.02); *H10K 59/1213* (2023.02); *H10K 71/80* (2023.02)

(58) Field of Classification Search
  CPC ....... H01L 24/05; H01L 25/167; H01L 25/18; H01L 2224/03002; H01L 2224/05558; H01L 2224/05573; H05K 1/181; H05K 3/3426
  See application file for complete search history.

(56) References Cited

FOREIGN PATENT DOCUMENTS

| | | |
|---|---|---|
| CN | 111128080 A | 5/2020 |
| CN | 112133729 A | 12/2020 |
| KR | 10-2018-0078672 A | 7/2018 |

\* cited by examiner

DISPLAY SUBSTRATE, PREPARATION METHOD THEREFOR, AND DISPLAY DEVICE

CROSS-REFERENCE TO RELATED APPLICATIONS

The present application is a U.S. National Phase Entry of International Application PCT/CN2021/111729 having an international filing date of Aug. 10, 2021, which claims priority of Chinese Patent Application No. 202011020687.7, filed to the CNIPA on Sep. 25, 2020 and entitled "Display Substrate, Preparation Method Therefor, and Display Device", and the contents disclosed in the above-mentioned applications are hereby incorporated as a part of this application.

TECHNICAL FIELD

Embodiments of the present disclosure relate to, but are not limited to, the field of display technology, and particularly to a display substrate, a method for preparing a display substrate, and a display device.

BACKGROUND

Display screens are trending towards being thinner and lighter with narrower bezels or no bezels. Some display substrates realize narrow lower bezels by using a Pad Bending structure, wherein the bonding region is bent to the back of the display substrate by a design of a bending area, thus achieving a narrow bezel. With this method, a width of the lower bezel of the display substrate may be reduced to about 3.0 mm. However, the display substrate with a Pad Bending structure is prone to film peeling, cracking, etc. in the bending area, the yield of the display substrate is relatively low, and due to the limitation of the bending radius, it is technically more difficult to reduce the width of the lower bezel.

SUMMARY

The following is a summary of subject matters described herein in detail. The summary is not intended to limit the protection scope of the claims.

An embodiment of the present disclosure provides a display substrate, including a display region and a bonding region located on a side of the display region, wherein the bonding region includes a bonding structure layer disposed on a base substrate, the bonding structure layer includes a composite insulating layer disposed on the base substrate, the bonding region further includes a step structure formed by the base substrate and the composite insulating layer, heights of steps in the step structure decrease sequentially in a direction away from the display region, and the base substrate is provided with a first step having a smallest height in the step structure; the bonding structure layer further includes a signal connection line, at least a portion of the signal connection line is disposed on the step structure and located on the first step, the base substrate at the first step is provided with an opening exposing the signal connection line, and a portion of the signal connection line exposed by the opening is provided with a bonding pin.

An embodiment of the present disclosure further provides a display device including the display substrate.

An embodiment of the present disclosure further provides a method for preparing a display substrate, the display substrate including a display region and a bonding region located on a side of the display region, the method including:

forming a composite insulating layer on a base substrate of the bonding region, wherein the base substrate and the composite insulating layer form a step structure in which heights of steps decrease sequentially in a direction away from the display region and in which the base substrate is provided with a first step having a smallest height;

forming a signal connection line in the bonding region, wherein at least a portion of the signal connection line is disposed on the step structure and located on the first step; and forming an opening on the base substrate at the first step, the opening exposing the signal connection line, and a portion of the signal connection line exposed by the opening forming a bonding pin.

Other aspects may be understood upon reading and understanding of the drawings and the detailed description.

BRIEF DESCRIPTION OF DRAWINGS

Accompanying drawings are used for providing understanding of technical solutions of the present disclosure, and form a part of the specification. They are used for explaining the technical solutions of the present disclosure together with the embodiments of the present disclosure, and do not form a limitation on the technical solutions of the present disclosure.

DETAILED DESCRIPTION

Those of ordinary skills in the art should understand that modification or equivalent replacement may be made to the technical solutions of the embodiments of the present disclosure without departing from the spirit and scope of the technical solutions of the embodiments of the present disclosure, and should fall within the scope of the claims of the present disclosure.

Figure 1:
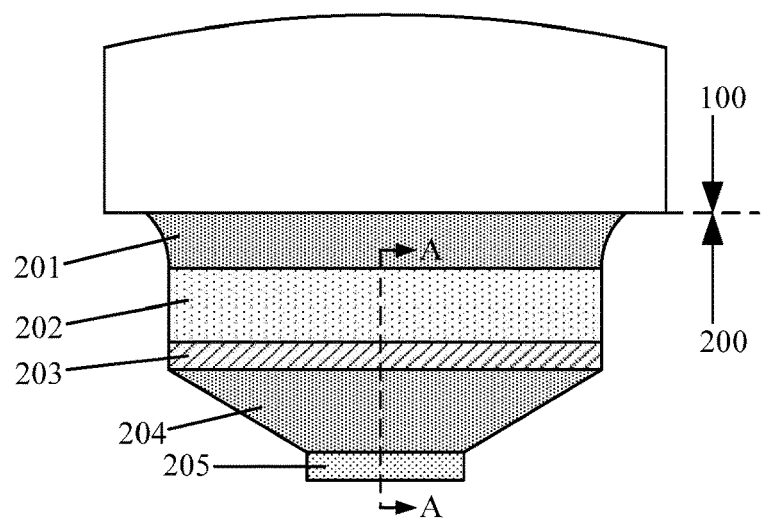
FIG. 1 is a schematic diagram of a planar structure of a bonding region of a display substrate in some technologies.

In some technologies, in order to reduce a width of a lower bezel of a display substrate (the bezel of a side edge where a bonding region of the display substrate is located), a drive IC is mounted on the display substrate by chip on film (COF) or Chip On Pi (COP). A lower bezel region (i.e., the bonding region) includes a wiring area and a bonding pin area. In the COF solution, an drive Integrated Circuit (IC) is fixed on a thin film circuit board body of the COF, the COF is bonded to the display substrate, and the thin film circuit board body of the COF is bent to locate the drive IC on the back side of the display substrate, the drive IC does not need to be bonded to the display substrate, thus reducing the width of the lower bezel of the display substrate. However, the COF solution cannot meet the requirement for a narrower bezel. In the COP solution, the bonding region of the display substrate is bent to the back of the display substrate, and a Flexible Printed Circuit (FPC) and the drive IC are bonded to the bonding region that has been bent to the back of the display substrate, so the width of the lower bezel can be greatly reduced. The width of the lower bezel can be reduced to about 2.5 mm by using the COP solution. A schematic diagram of a planar structure of a display substrate in the COP solution is as shown in FIG. 1, in which the display substrate includes a display region 100 and a bonding region 200 located on a side of the display region 100. The bonding region 200 includes a first fanout area 201, a bending area 202, an anti-static area 203, a second fanout area 204 and a bonding pin area 205 arranged sequentially in a direction away from the display region 100. In a Pad Bending process in the COP solution, the bonding region 200 is bent to the back side of the display region 100 along the bending area 202. The first fanout area 201 includes a plurality of data connection lines. The plurality of data connection lines are configured to be connected to Data Lines of the display region 100 in a Fanout wiring manner. The second fanout area 204 includes a plurality of data connection lines that are led out in a fanout wiring manner. The anti-static area 203 includes an anti-static circuit, and is configured to prevent electrostatic damages to the display substrate by eliminating static electricity. The bonding pin area 205 includes a plurality of Bonding Pads that may be configured to be bonding-connected to a flexible printed circuit and a drive IC. The drive IC receives a signal transmitted by the FPC and drives the display substrate (Panel) for display.

Figure 2:
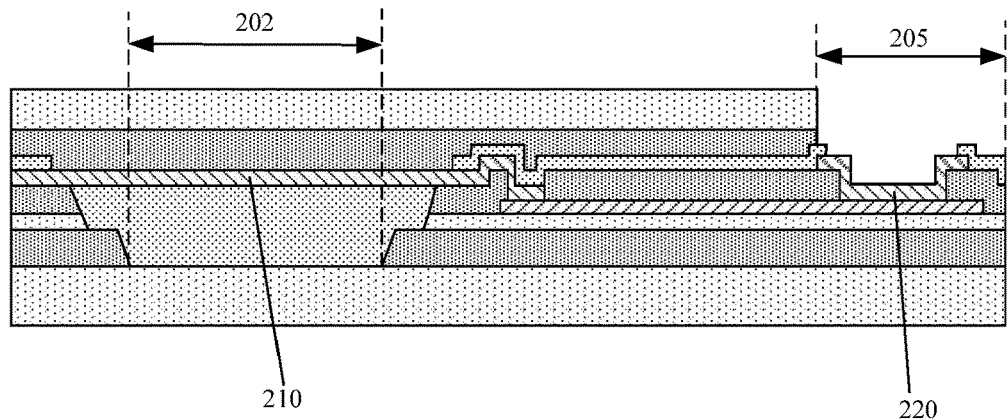
FIG. 2 is a schematic diagram of a cross-sectional structure of along A-A in FIG. 1.

FIG. 2 is a sectional view of the display substrate along A-A in FIG. 1. As shown in FIG. 2, the bending area 202 includes a signal line lead (such as a data connection line) 210, and the bonding pin area 205 includes a bonding pad 220 connected to the signal line lead 210. In the Pad Bending process in the COP solution, peeling of film layers, cracking, corrosion of metal wires and other defects often occur in the bending area 202. Therefore, the yield of the display substrates using the COP solution is low, and due to the bending radius, there are difficulties in reducing the width of the lower bezel of the display substrate.

Figure 3:
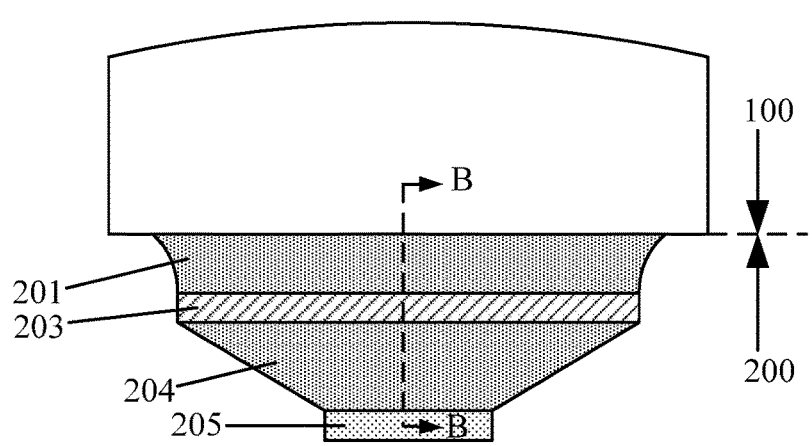
FIG. 3 is a schematic diagram of a planar structure of a bonding region of a display substrate in some exemplary embodiments.

FIG. 3 is a schematic diagram of a planar structure of a display substrate according to the present disclosure. As shown in FIG. 3, the display substrate includes a display region 100 and a bonding region 200 located on a side of the display region 100. The bonding region 200 may include a first fanout area 201, an anti-static area 203, a second fanout area 204 and a bonding pin area 205 that are arranged sequentially in a direction away from the display region 100. The first fanout area 201 may include a plurality of signal leads. The plurality of signal leads are, for example, a plurality of data connection lines, and the plurality of data connection lines are configured to be connected to data lines of the display region 100 in a fanout wiring manner. The second fanout area 204 includes a plurality of signal leads (such as a plurality of data connection lines) that are led out in a fanout wiring manner. The anti-static area 203 includes an anti-static circuit, and is configured to prevent electro-static damages to the display substrate by eliminating static electricity. The bonding pin area 205 includes a plurality of bonding pins (or Bonding pads). The bonding pins may be configured to be bonding-connected to one end of a Chip On Film, and the other end of the Chip On Film is configured to be bonding-connected to a flexible printed circuit. The Chip On Film receives a signal transmitted by the flexible printed circuit and transmits an output signal to the display substrate to drive the display substrate for display.

Figure 4:
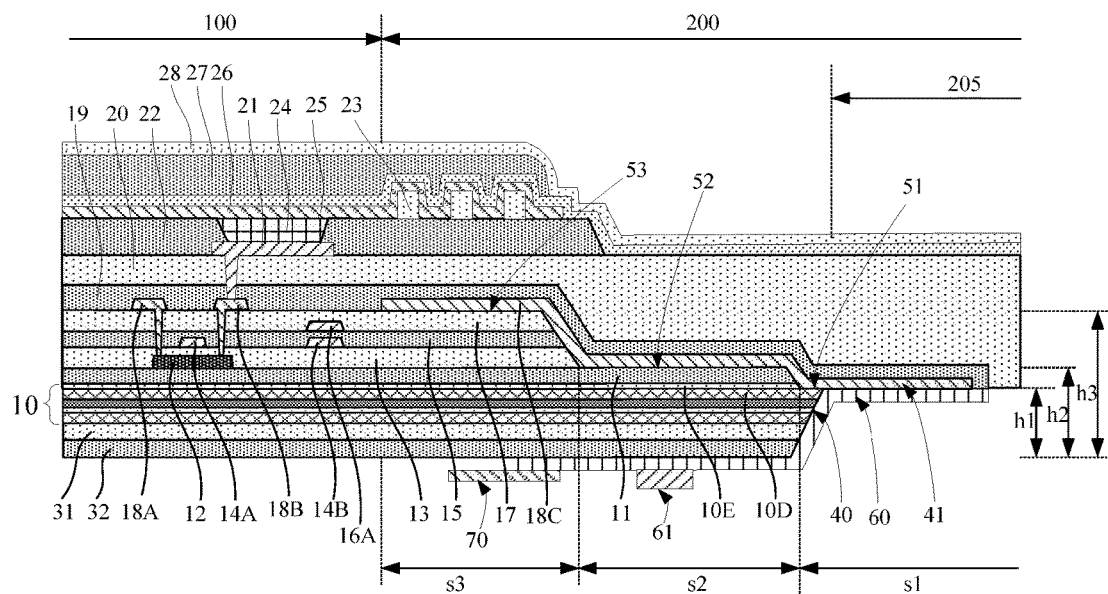
FIG. 4 is a schematic diagram of a cross-sectional structure of along B-B in FIG. 3 in some exemplary embodiments.

FIG. 4 is a sectional view of the display substrate along B-B in FIG. 3. As shown in FIG. 4, a display substrate according to an embodiment of the present disclosure includes a display region 100 and a bonding region 200 located on a side of the display region 100. The bonding region 200 includes a bonding structure layer disposed on a base substrate 10. The bonding structure layer includes a first composite insulating layer disposed on the base substrate 10. The bonding region 200 further includes a first step structure formed by the base substrate 10 and the first composite insulating layer. In the first step structure, heights of steps decrease sequentially in a direction away from the display region 100. The base substrate 10 is provided with a first step 51 having the smallest height in the first step structure. The bonding structure layer further includes a signal connection line. At least a portion of the signal connection line is disposed on the first step structure and located on the first step 51. The base substrate 10 at the first step 51 is provided with an opening 40 exposing the signal connection line, and a portion of the signal connection line exposed by the opening 40 is provided with a bonding pin 41.

In the display substrate according to the embodiment of the present disclosure, at least a portion of the signal connection line of the bonding region 200 is disposed on the first step structure and located on the base substrate 10. The opening 40 is provided on the base substrate 10 to expose the signal connection line, and the portion of the signal connection line exposed by the opening 40 is used as the bonding pin 41. In this way, when the display substrate is bonding-connected to an external circuit board, the external circuit board may be bonded to the bonding pin 41 on the back side of the display substrate (i.e., the side facing away from the display side), the bonding region 200 of the display substrate does not need to be bent to the back side of the display substrate, then the bonding region 200 of the display substrate may not be provided with a bending area for bending the bonding region 200, which, when compared with the solution of bending the bonding region 200 to the back side of the display substrate in some technologies, may reduce the defects such as peeling of film layers and cracking caused by bending the bonding region 200, and improve the product yield, and may reduce the width of the bezel of the side edge where the bonding region 200 of the display substrate is located.

In some exemplary embodiments, as shown in FIG. 4, the bonding structure layer further includes a metal wiring layer disposed on the first composite insulating layer, wherein the metal wiring layer includes a signal lead 18C connected to a signal line in the display region 100. The signal connection line includes the signal lead 18C, wherein the signal lead 18C is disposed on the first step structure and located on the first step 51, and a portion of the signal lead 18C exposed by the opening 40 is provided with the bonding pin 41.

In some exemplary embodiments, as shown in FIG. 4, the display region 100 includes a drive structure layer and a light emitting structure layer disposed on the drive structure layer. The drive structure layer is provided with a pixel drive circuit, the drive structure layer includes a source-drain metal layer including a source electrode 18A and a drain electrode 18B, and the metal wiring layer and the source-drain metal layer are disposed in a same layer.

In an example of this embodiment, the drive structure layer 102 in the display region 100 includes a pixel drive circuit, and the pixel drive circuit includes a plurality of transistors and a storage capacitor. FIG. 4 illustrates an example in which there are one drive transistor and one storage capacitor. The drive structure layer in the display region 100 includes a first insulating layer 11 disposed on a flexible base substrate 10, an active layer 12 disposed on the first insulating layer 11, a second insulating layer 13 overlying the active layer 12, a first gate metal layer disposed on the second insulating layer 13, a third insulating layer 15 overlying the first gate metal layer, a second gate metal layer disposed on the third insulating layer 15, a fourth insulating layer 17 overlying the second gate metal layer, a source-drain metal layer disposed on the fourth insulating layer 17 and a fifth insulating layer 19 overlying the source-drain metal layer. The first gate metal layer at least includes a gate electrode 14A and a first capacitor electrode 14B. The second gate metal layer at least includes a second capacitor electrode 16A. The source-drain metal layer at least includes a source electrode 18A and a drain electrode 18B. The active layer 12, the gate electrode 14A, the source electrode 18A, and the drain electrode 18B constitute the drive transistor.

The first capacitor electrode 14B and the second capacitor electrode 16A constitute the storage capacitor.

A planarization layer 20 may be provided on the drive structure layer of the display region 100, the planarization layer 20 is disposed on the fifth insulating layer 19, and the light emitting structure layer is disposed on the planarization layer 20. The light emitting structure layer includes: an anode 21, a pixel definition layer 22, an organic light emitting layer 24 and a cathode 25 which are disposed on the planarization layer 20. The organic light emitting layer 24 may be disposed in an opening of the pixel definition layer 22 and between the anode 21 and the cathode 25, and the organic light emitting layer 24 emits light under a voltage between the anode 21 and the cathode 25. The display region 100 further includes an encapsulation structure layer disposed on the light emitting structure layer, and the encapsulation structure layer may include a first inorganic encapsulation layer 26, an organic encapsulation layer 27 and a second inorganic encapsulation layer 28.

In some exemplary embodiments, the base substrate 10 includes a first flexible layer 10A, a first barrier layer 10B, an amorphous silicon layer 10C, a second flexible layer 10D and a second barrier layer 10E that are stacked sequentially. The first composite insulating layer in the bonding region 200 includes a first insulating layer 11, a second insulating layer 13, a third insulating layer 15 and a fourth insulating layer 17 that are stacked on the second barrier layer 10E. The first step structure includes a first step 51 formed by the first flexible layer 10A, the first barrier layer 10B, the amorphous silicon layer 10C and the second flexible layer 10D, a second step 52 formed by the second barrier layer 10E and the first insulating layer 11, and a third step 53 formed by the second insulating layer 13, the third insulating layer 15 and the fourth insulating layer 17. The heights of the first step 51, the second step 52 and the third step 53 increase sequentially. The signal lead 18C is disposed on the third step 53, the second step 52 and the first step 51. Alternatively, in other examples, the base substrate 10 includes the second flexible layer 10D and the second barrier layer 10E which are stacked, but does not include the first flexible layer 10A, the first barrier layer 10B and the amorphous silicon layer 10C, then the first step 51 includes the second flexible layer 10D, but does not include the first flexible layer 10A, the first barrier layer 10B and the amorphous silicon layer 10C.

In this specification, a height of a step refers to a distance from a surface of the step to a surface of the flexible base substrate 10 facing away from the display side. As shown in FIG. 4, the height h1 of the first step 51, the height h2 of the second step 52 and the height h3 of the third step 53 increase sequentially. In a direction parallel to the base substrate 10, a width s1 of the first step 51 may be a distance from an edge of the second flexible layer 10D to an edge of the second step 52, a width s2 of the second step 52 may be a distance from the edge of the second step 52 to an edge of the third step 53, and a width s3 of the third step 53 may be a distance from the edge of the third step 53 to an edge of the display region 100.

A structure of a display substrate according to the present disclosure is described below by an example of a preparation process of a display substrate. A "patterning process" mentioned in the present disclosure includes treatments such as film layer deposition, photoresist coating, mask exposure, development, etching, and photoresist stripping. The deposition may be any one or more of sputtering, evaporation and chemical vapor deposition.

The coating may be any one or more of spray coating and spin coating. The etching may be any one or more of dry etching and wet etching. A "thin film" refers to a layer of thin film manufactured with a certain material on a base substrate using a deposition or coating process. If the "thin film" does not need a patterning process in the entire manufacturing process, the "thin film" may also be called a "layer". If the "thin film" needs a patterning process in the entire manufacturing process, the "thin film" is called a "thin film" before the patterning process is performed and is called a "layer" after the patterning process is performed. The "layer" which has experienced the patterning process includes at least one "pattern". "A and B being disposed in the same layer" in the present disclosure means that A and B are formed simultaneously through a single patterning process. "An orthographic projection of A including an orthographic projection of B" means that the orthographic projection of B falls within a range of the orthographic projection of A, or the orthographic projection of A covers the orthographic projection of B.

In some exemplary embodiments, the preparation process of the display substrate in FIG. 4 may include the following steps.

(1) A flexible base substrate 10 is prepared on a glass carrier plate 1.

Figure 5:
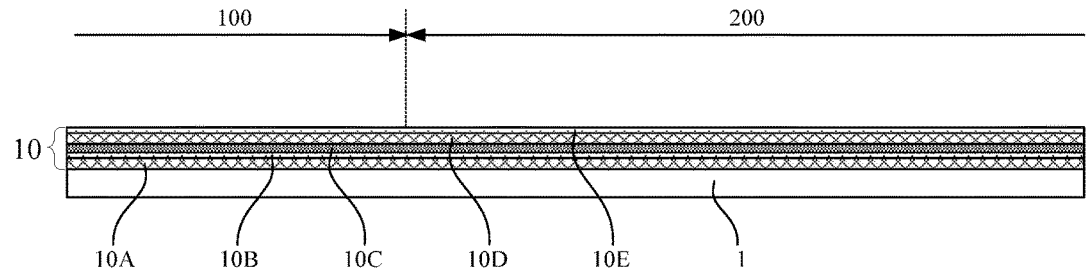
FIG. 5 is a schematic diagram of a structure after a base substrate is formed in some exemplary embodiments.

In an example of an embodiment of the present disclosure, the flexible base substrate 10 may have a two-layer flexible layer structure. The flexible base substrate 10 includes a first flexible material layer, a first inorganic material layer, a semiconductor layer, a second flexible material layer and a second inorganic material layer which are stacked on the glass carrier plate 1. The first flexible material layer and the second flexible material layer may be made of polyimide (PI), polyethylene terephthalate (PET), a surface-treated polymer soft film, or the like. The first inorganic material layer and the second inorganic material layer may be made of silicon nitride (SiNx), silicon oxide (SiOx) or the like to improve water and oxygen resistance of the base substrate. The first inorganic material layer and the second inorganic material layer may be called Barrier layers. The semiconductor layer may be made of amorphous silicon (a-si). In an exemplary implementation mode, taking a laminated structure PI1/Barrier1/a-si/PI2/Barrier2 as an example, a preparation process of the flexible base substrate 10 may include: first coating a layer of polyimide on the glass carrier plate 1 to form a first flexible (PI1) layer 10A after it is cured into a film; then depositing a layer of barrier thin film on the first flexible layer 10A to form a first barrier (Barrier1) layer 10B overlying the first flexible layer 10A; then depositing a layer of amorphous silicon thin film on the first barrier layer 10B to form an amorphous silicon (a-si) layer 10C overlying the first barrier layer 10B; then coating a layer of polyimide on the amorphous silicon layer 10C to form a second flexible (PI2) layer 10D after it is cured into a film; and then depositing a layer of barrier thin film on the second flexible layer 10D to form a second barrier (Barrier2) layer 10E overlying the second flexible layer 10D, thereby completing the preparation of the flexible base substrate 10, as shown in FIG. 5. After this process, both the display region 100 and the bonding region 200 include the flexible base substrate 10.

In other examples, the flexible base substrate 10 may have a one-layer flexible layer structure. For example, the flexible base substrate 10 includes a flexible (PI) layer and a barrier layer which are stacked. The flexible base substrate 10 in this example may be the stacked second flexible (PI2) layer 10D and second barrier (Barrier 2) layer 10E, which are left after the first flexible (PI1) layer 10A, the first barrier (Barrier1) layer 10B and the amorphous silicon (a-si) layer 10C in FIG. 5 have been removed. For the flexible base substrate 10, the use of the one-layer flexible layer structure is more advantageous to providing an opening 40 on the flexible base substrate 10 subsequently than the use of a two-layer flexible layer structure.

Figure 6:
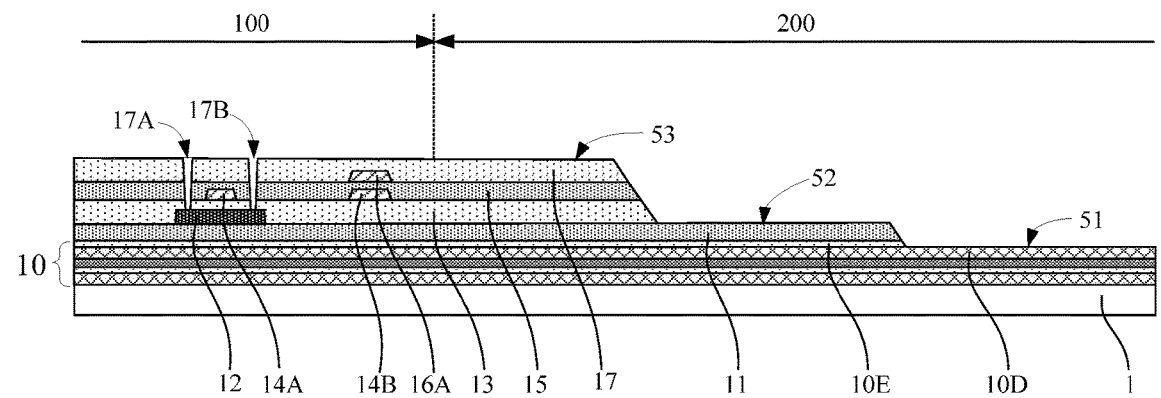
FIG. 6 is a schematic diagram of a structure after a first composite insulating layer and a first step structure are formed in some exemplary embodiments.

(2) Some of the film layers of a drive structure layer of the display region 100 and a first composite insulating layer of the bonding region 200 are prepared on the flexible base substrate 10, and a first step structure is formed in the bonding region 200. In an exemplary implementation mode, as shown in FIG. 6, the preparation process of this step may include the followings:

A first insulating thin film and an active layer thin film are sequentially deposited on the flexible base substrate 10, and the active layer thin film is patterned by a patterning process to form a first insulating layer 11 overlying the entire flexible base substrate 10 and a pattern of an active layer disposed on the first insulating layer 11. The pattern of the active layer is formed in the display region and at least includes an active layer 12. After this patterning process, the bonding region 200 includes the first insulating layer 11 disposed on the flexible base substrate 10.

Subsequently, a second insulating thin film and a first metal thin film are sequentially deposited, and the first metal thin film is patterned by a patterning process to form a second insulating layer 13 overlying the pattern of the active layer and a pattern of a first gate metal layer disposed on the second insulating layer 13. The pattern of the first gate metal layer is formed in the display region 100 and at least includes a gate electrode 14A and a first capacitor electrode 14B. After this patterning process, the bonding region 200 includes the first insulating layer 11 and the second insulating layer 13 stacked on the flexible base substrate 10.

Subsequently, a third insulating thin film and a second metal thin film are sequentially deposited, and the second metal thin film is patterned by a patterning process to form a third insulating layer 15 overlying the first gate metal layer and a pattern of a second gate metal layer disposed on the third insulating layer 15. The pattern of the second gate metal layer is formed in the display region 100 and at least includes a second capacitor electrode 16A, wherein a position of the second capacitor electrode 16A corresponds to that of the first capacitor electrode 14B. After this patterning process, the bonding region 200 includes the first insulating layer 11, the second insulating layer 13 and the third insulating layer 15 which are stacked on the flexible base substrate 10.

Subsequently, a fourth insulating thin film is deposited, the fourth insulating thin film of the display region 100 and a composite insulating thin film (the composite insulating thin film includes the first insulating layer 11, the second insulating layer 13, the third insulating layer 15 and the fourth insulating thin film stacked on the flexible base substrate 10) of the bonding region 200 are patterned by a patterning process to form a pattern of a fourth insulating layer 17 overlying the second gate metal layer in the display region 100 and to form a first step structure in the bonding region 200. The patterning process in this step may be carried out by the following two patterning processes.

First, the fourth insulating thin film, the third insulating layer 15 and the second insulating layer 13 in the display region 100 and the bonding region 200 are etched using a first mask, to form a via hole 17A and a via hole 17B on the fourth insulating thin film, the third insulating layer 15 and the second insulating layer 13 in the display region 100, and the fourth insulating thin film, the third insulating layer 15 and the second insulating layer 13 in the via hole 17A and the via hole 17B are etched away to expose a surface of the active layer 12. A first groove is formed on the fourth insulating thin film, the third insulating layer 15 and the second insulating layer 13 in the bonding region 200, and the fourth insulating thin film, the third insulating layer 15 and the second insulating layer 13 in the first groove are etched away to expose a surface of the first insulating layer 11. The first insulating layer 11 in the first groove and the second barrier layer 10E of the flexible base substrate 10 in the bonding region 200 are then etched using a second mask to form a second groove on the first insulating layer 11 and the second barrier layer 10E, and the first insulating layer 11 and the second barrier layer 10E in the second groove are etched away to expose a surface of the second flexible layer 10D of the flexible base substrate 10. In this way, in the bonding region 200, the first groove exposes the second groove, and the second groove exposes the second flexible layer 10D of the flexible base substrate 10, thereby forming the first step structure. The first step structure includes a first step 51 formed by the first flexible layer 10A, the first barrier layer 10B, the amorphous silicon layer 10C and the second flexible layer 10D, a second step 52 formed by the second barrier layer 10E and the first insulating layer 11, and a third step 53 formed by the second insulating layer 13, the third insulating layer 15 and the fourth insulating layer 17. Heights of the first step 51, the second step 52 and the third step 53 increase sequentially. In an example in which the flexible base substrate 10 uses a one-layer flexible layer structure, the first step 51 includes the second flexible layer 10D, but does not include the first flexible layer 10A, the first barrier layer 10B and the amorphous silicon layer 10C.

After this patterning process, as shown in FIG. 6, the first composite insulating layer is formed in the bonding region 200, and the first composite insulating layer includes the first insulating layer 11, the second insulating layer 13, the third insulating layer 15 and the fourth insulating layer 17 which are stacked on the flexible base substrate 10. The first composite insulating layer and the flexible base substrate 10 form the first step structure. The first step structure includes the first step 51, the second step 52 and the third step 53, and the heights of the first step 51, the second step 52 and the third step 53 increase sequentially.

(3) A source-drain metal layer and a metal wiring layer, as well as a fifth insulating layer overlying the source-drain metal layer and the metal wiring layer, are formed in the display region 100 and the bonding region 200, respectively.

Figure 7:
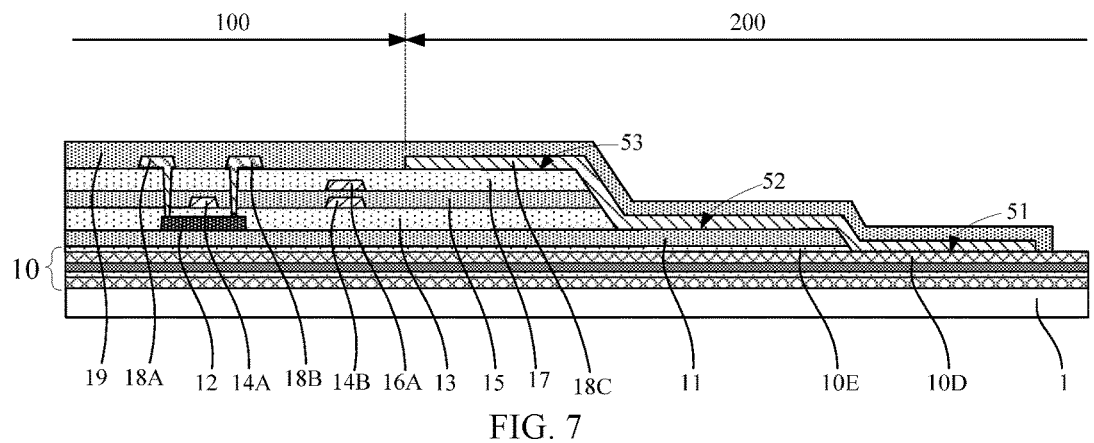
FIG. 7 is a schematic diagram of a structure after a metal wiring layer and a fifth insulating layer are formed in some exemplary embodiments.

In some exemplary embodiments, a third metal thin film is deposited on the flexible base substrate 10 on which the aforementioned patterns are formed, and the third metal thin film is patterned by a patterning process to form a pattern of a source-drain metal layer on the fourth insulating layer 17 in the display region 100 and a pattern of a metal wiring layer on the first step structure in the bonding region 200. As shown in FIG. 7, the source-drain metal layer includes a source electrode 18A and a drain electrode 18B, the source electrode 18A is connected to a surface of the active layer 12 away from the flexible base substrate 10 through the via hole 17A, and the drain electrode 18B is connected to the surface of the active layer 12 away from the flexible base substrate 10 through the via hole 17B. The metal wiring layer includes a signal lead 18C disposed on the first step 51, the second step 52 and the third step 53 of the first step structure.

Subsequently, a fifth insulating thin film is deposited in the display region 100 and the bonding region 200 to form a pattern of a fifth insulating layer 19 overlying the source-drain metal layer and the metal wiring layer.

At this point, a pattern of the drive structure layer has been prepared in the display region 100 of the flexible base substrate 10, and film layers of the bonding structure layer have been prepared in the bonding region 200, as shown in FIG. 7, the active layer 12, the gate electrode 14A, the source electrode 18A and the drain electrode 18B constitute a transistor which may be a drive transistor in a pixel drive circuit, and the first capacitor electrode 14B and the second capacitor electrode 16A constitute a storage capacitor.

In an exemplary implementation mode, the first insulating thin film, the second insulating thin film, the third insulating thin film, the fourth insulating thin film and the fifth insulating thin film may be made of any one or more of silicon oxide (SiOx), silicon nitride (SiNx) and silicon oxynitride (SiON), and may be in a single layer, multiple layers or a composite layer. The first insulating layer 11 is referred to as a buffer layer, which is used for improving the water and oxygen resistance of the flexible base substrate 10. The second insulating layer 13 and the third insulating layer 15 are referred to as gate insulating (GI) layers. The fourth insulating layer 17 is referred to as an interlayer dielectric (ILD) layer; and the fifth insulating layer is referred to as a passivation (PVX) layer. The first metal thin film, the second metal thin film and the third metal thin film may be made of metal materials, e.g., any one or more of silver (Ag), copper (Cu), aluminum (Al), titanium (Ti) and molybdenum (Mo), or an alloy material of the above metals, such as aluminum neodymium alloy (AlNd) or molybdenum niobium alloy (MoNb), and may have a single-layer structure or a multi-layer composite structure, such as Ti/Al/Ti, etc. The active layer thin film may be made of materials, such as amorphous indium gallium zinc oxide (a-IGZO), zinc oxynitride (ZnON), indium zinc tin oxide (IZTO), amorphous silicon (a-Si), polycrystalline silicon (p-Si), sexithiophene, or polythiophene. That is, the present disclosure is applicable to transistors manufactured based on oxide technology, silicon technology or organic matter technology.

Figure 8:
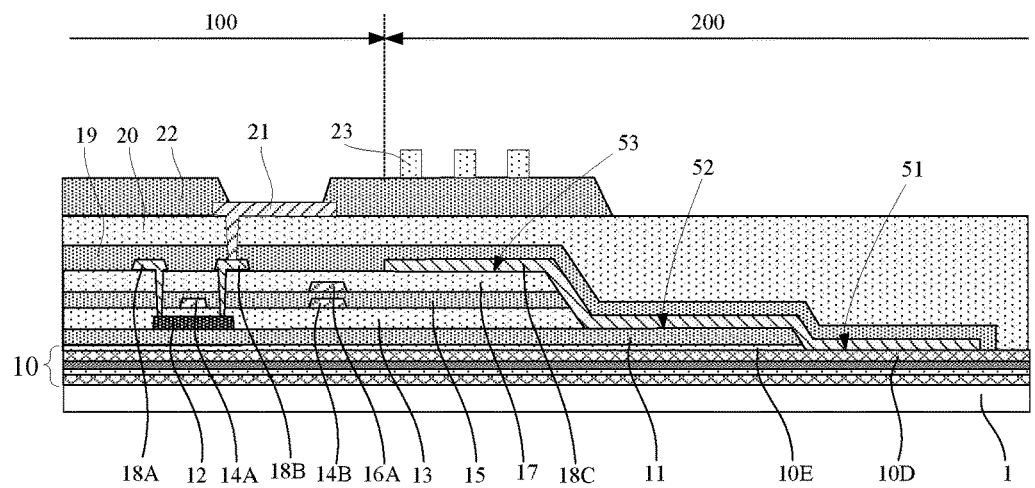
FIG. 8 is a schematic diagram of a structure after a planarization layer, an anode, a pixel definition layer and a post spacer are formed in some exemplary embodiments.

(4) A planarization layer 20 is formed on the flexible base substrate 10 on which the aforementioned patterns are formed, an anode 21 of a light emitting structure layer and a pixel definition layer 22 are formed in the display region 100, and post spacers 23 are formed in the bonding region 200, as shown in FIG. 8.

In some exemplary embodiments, a planarization thin film of an organic material is coated on the flexible base substrate 10 on which the aforementioned patterns are formed to form a planarization (PLN) layer 20 overlying the entire flexible base substrate 10, and a via hole is formed on the planarization layer 20 and the fifth insulating layer 19 in the display region 100 by masking, exposure and development processes. The planarization layer 20 and the fifth insulating layer 19 in the via hole are developed away to expose a surface of the drain electrode 18B of the drive transistor.

A transparent conductive thin film is deposited on the flexible base substrate 10 on which the aforementioned patterns are formed, and the transparent conductive thin film is patterned by a patterning process to form a pattern of an anode 21. The anode 21 is formed on the planarization layer 20 in the display region 100 and is connected to the drain electrode 18B of the drive transistor through the via hole on the planarization layer 20 and the fifth insulating layer 19. After this patterning process, the film layer structure of the bonding region 200 is not changed. In an exemplary implementation mode, the material of the transparent conductive thin film may be indium tin oxide (ITO) or indium zinc oxide (IZO).

A pixel definition thin film is coated on the flexible base substrate 10 on which the aforementioned patterns are formed, and a pattern of a pixel definition layer (PDL) 22 is formed by masking, exposure and development processes. The pixel definition layer 22 is formed in the display region 100 and in part of the bonding region 200 close to the display region 100. The pixel definition layer 22 in the display region 100 is provided with a pixel opening in which the pixel definition layer 22 is developed off to expose a surface of the anode 21.

A thin film of an organic material is coated on the flexible base substrate 10 on which the aforementioned patterns are formed, and patterns of a plurality of post spacers (PS) 23 are formed by masking, exposure, and development process. The plurality of post spacers 23 are formed on the pixel definition layer 22 in the bonding region 200.

Figure 9:
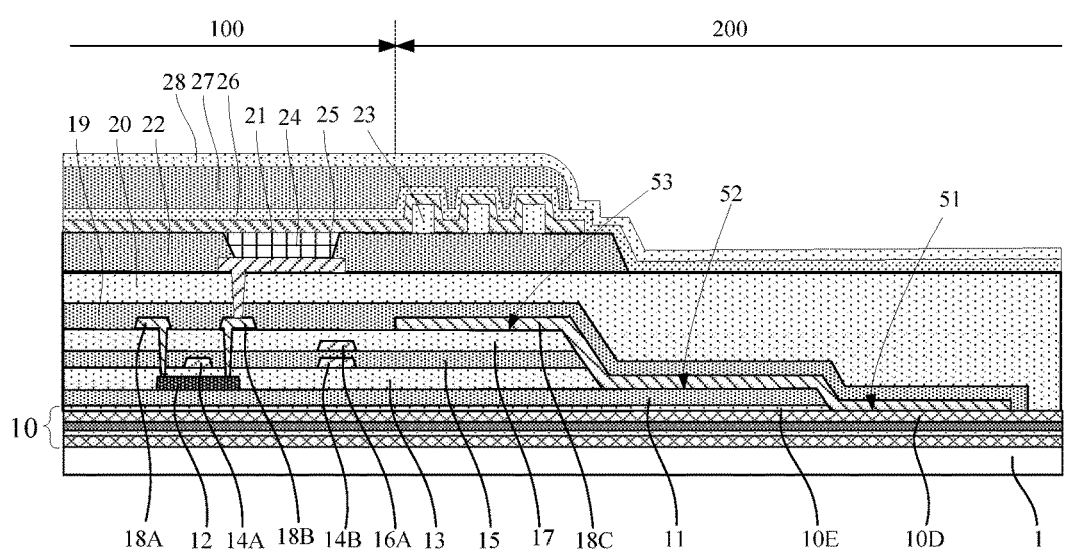
FIG. 9 is a schematic diagram of a structure after an organic light emitting layer, a cathode and an encapsulation structure layer are formed in some exemplary embodiments.

(5) An organic light emitting layer 24, a cathode 25 and an encapsulation structure layer are formed on the flexible base substrate 10 on which the aforementioned patterns are formed, as shown in FIG. 9.

In some exemplary embodiments, the organic light emitting layer 24 may be formed in the pixel opening of the pixel definition layer 22 in the display region 100 by an evaporation process to realize the connection between the organic light emitting layer 24 and the anode 21. The cathode 25 is formed on the pixel definition layer 22 and connected to the organic light emitting layer 24, and wraps around the plurality of post spacers 23 on the pixel definition layer 22 in the bonding region 200. In an exemplary implementation mode, the cathode 25 may be made of any one or more of magnesium (Mg), silver (Ag), aluminum (Al), copper (Cu) and lithium (Li), or an alloy made of any one or more of the above metals.

An encapsulation structure layer is formed on the flexible base substrate 10 on which the aforementioned patterns are formed. The encapsulation structure layer may include a first inorganic encapsulation layer 26, an organic encapsulation layer 27 and a second inorganic encapsulation layer 28 that are stacked. The first inorganic encapsulation layer 26 overlies the cathode 25 in the display region 100 and wraps around the plurality of post spacers 23 in the bonding region 200. The organic encapsulation layer 27 is disposed in the display region 100 and an area of the bonding region 200 where the post spacers 23 are located. The second inorganic encapsulation layer 28 overlies the first inorganic encapsulation layer 26 and the organic encapsulation layer 27.

Figure 10:
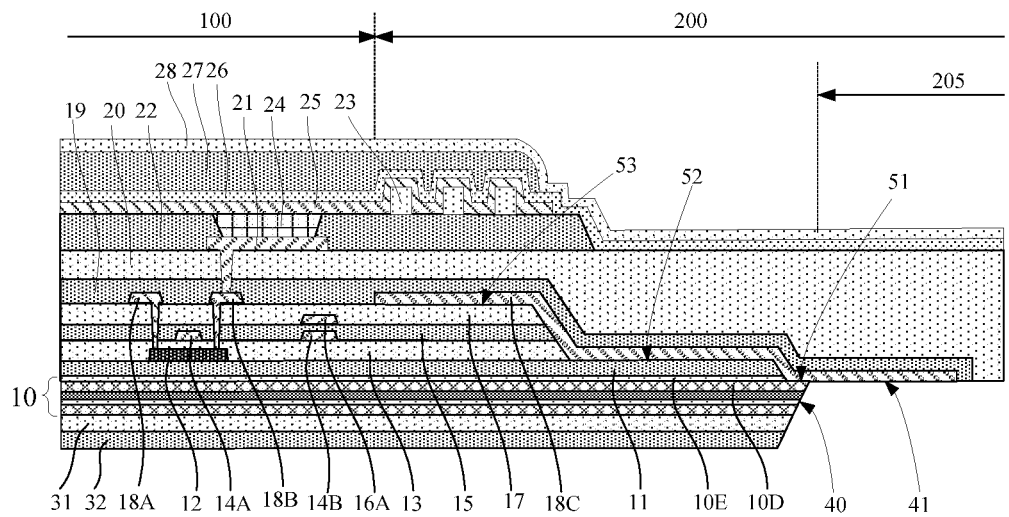
FIG. 10 is a schematic diagram of a structure after an auxiliary film layer is attached to and an opening is formed on a base substrate in some exemplary embodiments.

(6) The flexible base substrate 10 on which the aforementioned film layers are formed is peeled off from the glass carrier plate 1, and an auxiliary film layer is attached to a surface of the flexible base substrate 10 facing away from the display side. As an example, the auxiliary film layer may include a protective film 31, a heat dissipation film 32 and the like which are stacked. An opening 40 is formed in the flexible base substrate 10 and the auxiliary film layer at a position corresponding to the first step 51, wherein the opening 40 exposes the signal lead 18C on the first step 51, and a portion of the signal lead 18C exposed by the opening 40 is provided with a bonding pin 41. An area in the bonding region 200 where the bonding pin 41 is formed is a bonding pin area 205, and the bonding pin 41 in the bonding pin area 205 may be bonding-connected to an external circuit board, as shown in FIG. 10.

(7) The display substrate is bonding-connected to a drive IC and an FPC.

In some exemplary embodiments, as shown in FIG. 4, a drive IC may be bonded to the display substrate using a COF. The COF 60 includes a thin film circuit board body and a drive IC 61 fixed on the thin film circuit board body. One end of the thin film circuit board body of the COF 60 is bonding-connected to a bonding pin 41 of the display substrate, and the other end of the thin film circuit board body of the COF 60 is bonding-connected to an FPC 70. Both the COF 60 and the FPC 70 may be fixed to a surface of the display substrate facing away from the display side by an adhesive. The COF 60 receives a signal transmitted by the FPC 70 and transmits an output signal to the display substrate to drive the display substrate for display. In other examples, the bonding pin 41 may be directly bonding-connected to the drive IC or the FPC, and the drive IC or the FPC may be directly bonded to the back side of the display substrate.

Figure 11:
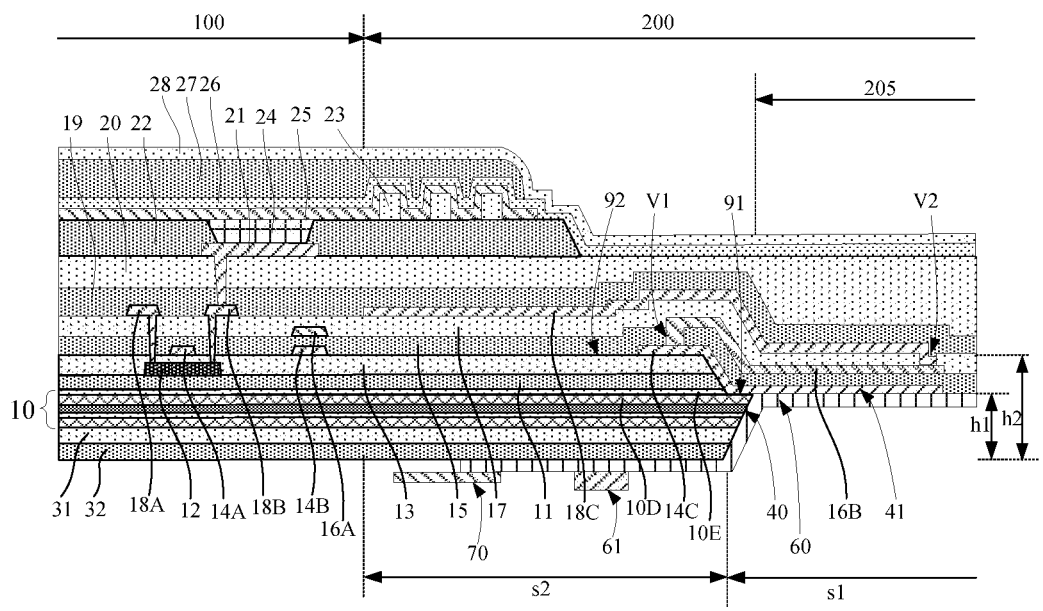
FIG. 11 is a schematic diagram of a partial sectional structure of a display substrate in some other exemplary embodiments.

FIG. 11 is another sectional view of the display substrate along B-B in FIG. 3. As shown in FIG. 11, a display substrate according to an embodiment of the present disclosure includes a display region 100 and a bonding region 200 located on a side of the display region 100. The bonding region 200 includes a bonding structure layer disposed on a base substrate 10. The bonding structure layer includes a second composite insulating layer disposed on the base substrate 10. The bonding region 200 further includes a second step structure formed by the base substrate 10 and the second composite insulating layer. In the second step structure, heights of the steps decrease sequentially in a direction away from the display region 100. The base substrate 10 is provided with a first step 91 having the smallest height in the second step structure. The bonding structure layer further includes a signal connection line. At least a portion of the signal connection line is disposed on the second step structure and located on the first step 91, the base substrate 10 at the first step 91 is provided with an opening 40 exposing the signal connection line, and a portion of the signal connection line exposed by the opening 40 is provided with a bonding pin 41.

In the display substrate according to the embodiment of the present disclosure, at least a portion of the signal connection line of the bonding region 200 is disposed on the second step structure and located on the base substrate 10, the opening 40 is provided on the base substrate 10 to expose the signal connection line, and the portion of the signal connection line exposed by the opening 40 is used as the bonding pin 41. In this way, when the display substrate is bonding-connected to an external circuit board, the external circuit board may be bonded to the bonding pin 41 on the back side of the display substrate (i.e., the side facing away from the display side), the bonding region 200 of the display substrate does not need to be bent to the back side of the display substrate, then the bonding region 200 of the display substrate may not be provided with a bending area for bending the bonding region 200, which, when compared with the solution of bending the bonding region 200 to the back side of the display substrate in some technologies, may reduce the defects such as peeling of film layers and cracking caused by bending the bonding region 200, and improve the product yield, and may reduce a width of bezel of a side edge where the bonding region 200 of the display substrate is located.

In some exemplary embodiments, as shown in FIG. 11, the bonding structure layer further includes a first metal conductive layer disposed on the second composite insulating layer, and a metal wiring layer disposed on a side of the first metal conductive layer away from the base substrate 10. The metal wiring layer includes a signal lead 18C connected to a signal line in the display region 100, the first metal conductive layer includes a first connection lead 14C connected to the signal lead 18C. The signal connection line includes the signal lead 18C and the first connection lead 14C, wherein the first connection lead 14C is disposed on the second step structure and located on the first step 91, and a portion of the first connection lead 14C exposed by the opening 40 is provided with the bonding pin 41.

In some exemplary embodiments, as shown in FIG. 11, the bonding structure layer further includes a second metal conductive layer arranged between the first metal conductive layer and the metal wiring layer. The second metal conductive layer includes a second connection lead 16B, wherein the second connection lead 16B is connected to the first connection lead 14C through a first via hole V1, and the signal lead 18C is connected to the second connection lead 16B through a second via hole V2.

In some exemplary embodiments, as shown in FIG. 11, the first via hole V1 is provided closer to the display region 100 than the second via hole V2, and the opening 40 is provided further away from the display region 100 than the first via hole V1.

Figure 20:
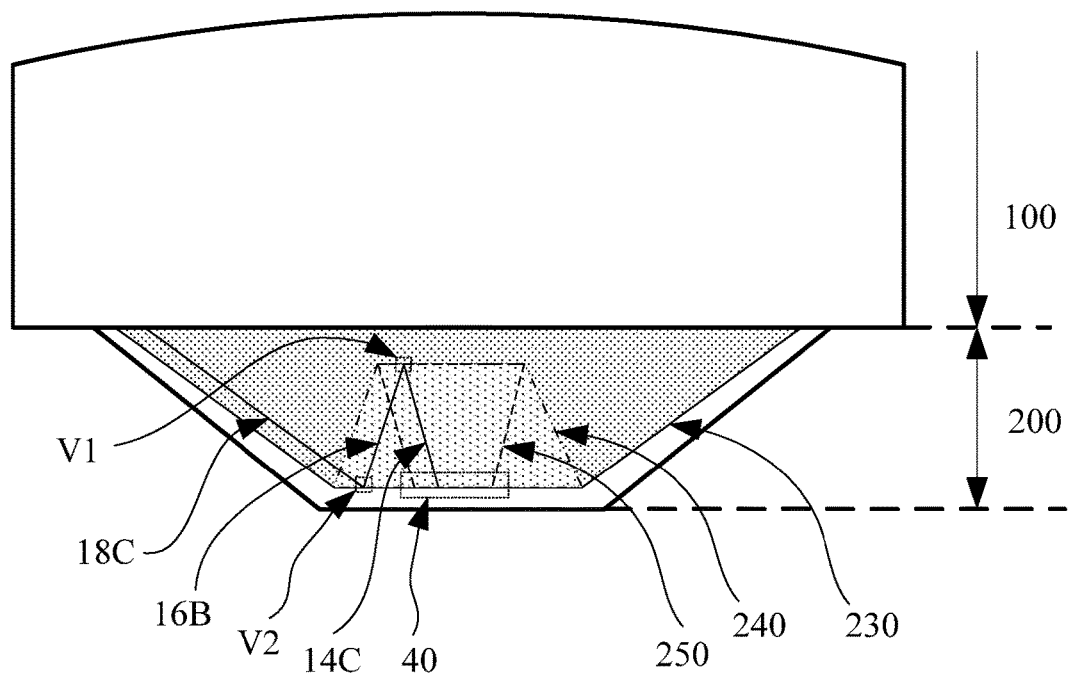
FIG. 20 is a schematic diagram of a planar structure of the display substrate in FIG. 11 in some other exemplary embodiments.

As an example, FIG. 20 is a schematic diagram of a planar structure of the display substrate shown in FIG. 11. As shown in FIG. 20, an area where the signal lead 18C is located is a first fanout area 230, an area where the second connection lead 16B is located is a second fanout area 240, and an area where the first connection lead 14C is located is a third fanout area 250. The signal lead 18C is connected to the second connection lead 16B through a second via hole V2, the second connection lead 16B is connected to the first connection lead 14C through a first via hole V1, and an end of the first connection lead 14C away from the display region 100 is exposed by an opening 40 to form a bonding pin 41. The first fanout area 230 is located in the metal wiring layer, the second fanout area 240 is located in the second metal conductive layer, the third fanout area 250 is located in the first metal conductive layer, and the first metal conductive layer is close to the base substrate 10. Wirings of the signal connection lines (including the signal lead 18C, the second connection lead 16B and the first connection lead 14C) in the first fanout area 230, the second fanout area 240 and the third fanout area 250 gradually converges, and the end of the first connection lead 14C in the third fanout area 250 close to the base substrate 10 away from the display region 100 is exposed by the opening 40, thereby forming the bonding pin 41.

Based on the design of narrow bezels and the requirements of bonding process, the signal lines in the display region 100 of the display substrate need to be gathered up when being led out, and the corresponding area is a fanout area. Under the condition of ensuring the line width, the existing exposure and etching processes determine that a wiring spacing in a fanout area should not be too small. Due to this, some solutions in which wiring is performed in a single layer require the fanout area to have a sufficient length in order to achieve a converging effect of the wiring, resulting in unobvious shortening in the lower bezel of the display substrate, as compared with the COP solution. In this example, the signal connection lines (including the signal lead 18C, the second connection lead 16B and the first connection lead 14C) are arranged in three film layers, i.e., the metal wiring layer, the second metal conductive layer and the first metal conductive layer. The wiring of the signal connection lines in the three film layers exhibits an "S-shaped" round-trip wiring manner. Moreover, the wiring gradually converges in the three film layers, and the end of the first connection lead 14C of the first metal conductive layer close to the base substrate 10 away from the display region 100 is exposed by the opening 40 to form the bonding pin 41. The wiring solution in this embodiment can significantly reduce the length of the fanout area, while enabling the signal connection lines to achieve the corresponding converging effect, thereby making the lower bezel of the display substrate narrower. In addition, in this example, the wiring solution of the signal connection lines in three film layers is shown, while in other examples, the signal connection lines may be arranged in two or more film layers.

In some exemplary embodiments, as shown in FIG. 11, the base substrate 10 includes the first flexible layer, the first barrier layer, the amorphous silicon layer, the second flexible layer 10D and the second barrier layer 10E that are sequentially stacked. The second composite insulating layer includes the first insulating layer 11 and the second insulating layer 13 that are sequentially stacked on the second barrier layer 10E. The second step structure includes a first step 91 formed by the first flexible layer, the first barrier layer, the amorphous silicon layer and the second flexible layer 10D, and a second step 92 formed by the second barrier layer 10E, the first insulating layer 11 and the second insulating layer 13. In a direction parallel to the base substrate 10, a width s1 of the first step 91 may be a distance from an edge of the second flexible layer 10D away from the display region 100 to an edge of the second step 92, and a width s2 of the second step 92 may be a distance from the edge of the second step 92 to an edge of the display region 100. A height h2 of the second step 92 is greater than a height h1 of the first step 91, and the second step 92 is disposed closer to the display region 100 than the first step 91. The first connection lead 14C is provided on the second step 92 and the first step 91, wherein the first step 91 is provided with the opening 40. Alternatively, in other examples, the base substrate 10 includes the second flexible layer 10D and the second barrier layer 10E that are stacked, but does not include the first flexible layer, the first barrier layer and the amorphous silicon layer, then the first step 91 includes the second flexible layer 10D, but does not include the first flexible layer, the first barrier layer and the amorphous silicon layer.

In some exemplary embodiments, as shown in FIG. 11, the bonding structure layer further includes a third insulating layer 15 overlying the first metal conductive layer, the second metal conductive layer is disposed on the third insulating layer 15, the bonding structure layer further includes a fourth insulating layer 17 overlying the second metal conductive layer, the metal wiring layer is disposed on the fourth insulating layer 17, the third insulating layer 15 is provided with the first via hole V1, and the fourth insulating layer is provided with the second via hole V2.

In some exemplary embodiments, as shown in FIG. 11, the display region 100 includes a drive structure layer and a light emitting structure layer disposed on the drive structure layer, wherein the drive structure layer is provided with a pixel drive circuit, and the pixel drive circuit includes a plurality of transistors and a storage capacitor. FIG. 11 illustrates an example in which there are one driving transistor and one storage capacitor. The drive structure layer in the display region 100 includes: a first insulating layer 11 disposed on the flexible base substrate 10, an active layer 12 disposed on the first insulating layer 11, a second insulating layer 13 overlying the active layer 12, a first gate metal layer disposed on the second insulating layer 13, a third insulating layer 15 overlying the first gate metal layer, a second gate metal layer disposed on the third insulating layer 15, a fourth insulating layer 17 overlying the second gate metal layer, and a source-drain metal layer disposed on the fourth insulating layer 17. The first gate metal layer at least includes a gate electrode 14A and a first capacitor electrode 14B. The second gate metal layer at least includes a second capacitor electrode 16A. The source-drain metal layer at least includes a source electrode 18A and a drain electrode 18B. The active layer 12, the gate electrode 14A, the source electrode 18A and the drain electrode 18B constitute the drive transistor. The first capacitor electrode 14B and the second capacitor electrode 16A constitute the storage capacitor. The first metal conductive layer and the first gate metal layer in the bonding region 200 may be disposed in a same layer, and the first connection lead 14C, the gate electrode 14A and the first capacitor electrode 14B may be formed simultaneously through a single patterning process. The second metal conductive layer and the second gate metal layer may be disposed in a same layer, and the second connection lead 16B and the second capacitor electrode 16A may be formed simultaneously through a single patterning process. The metal wiring layer and the source-drain metal layer may be disposed in a same layer, and the signal lead 18C, and the source electrode 18A and the drain electrode 18B may be formed simultaneously through a single patterning process.

In some exemplary embodiments, as shown in FIG. 11, the second connection lead 16B is connected to the first connection lead 14C on the second step 92 through the first via hole V1.

Figure 21:
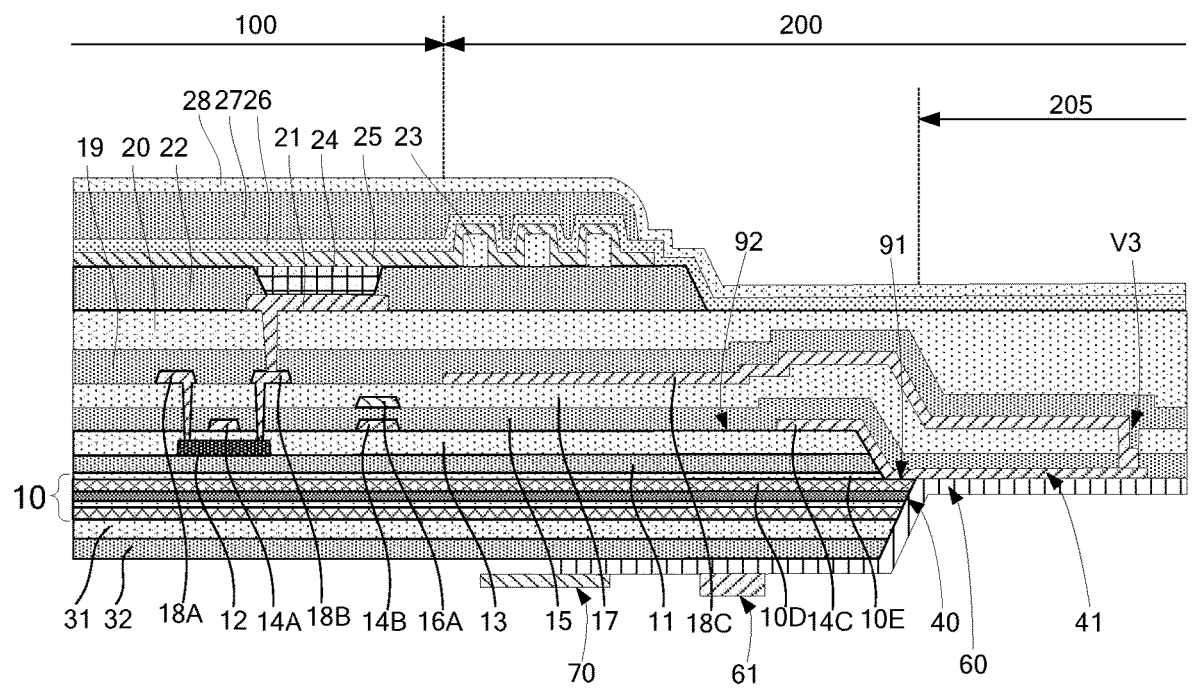
FIG. 21 is a schematic diagram of a partial sectional structure of a display substrate in some further exemplary embodiments.

In some exemplary embodiments, as shown in FIG. 21, an end of the signal lead 18C away from the display region 100 may be connected to an end of the first connection lead 14C away from the display region 100 through a via hole V3.

In this example, a first metal conductive layer is provided between the metal wiring layer and the base substrate 10, the first metal conductive layer includes a first connection lead 14C connected to the signal lead 18C, the first connection lead 14C is provided on the second step structure, and a portion of the first connection lead 14C exposed by the opening 40 is provided with the bonding pin 41. Since the first connection lead 14C may extend from a position (at the via hole V3) where it is connected to the signal lead 18C in a direction close to the display region 100, compared with the solution in which wiring is performed only in the metal wiring layer (e.g., the solution shown in FIG. 4), the solution in which the signal connection lines (including the signal lead 18C and the first connection lead 14C) are arranged in two film layers, i.e., the metal wiring layer and the first metal conductive layer, can further reduce a width of the bonding region 200 and therefore can reduce a width of bezel of a side edge of the display substrate where the bonding region 200 is located. Compared with the display substrate in FIG. 11, the display substrate in this example is not provided with the second connection lead 16B which is provided in the display substrate in FIG. 11, i.e., the signal lead 18C is directly connected to the first connection lead 14C through the via hole V3.

The structure of the display substrate in FIG. 11 of the present disclosure is described below by an example of a preparation process of a display substrate. In some exemplary embodiments, the preparation process of the display substrate in FIG. 11 may include the following steps.

Figure 12:
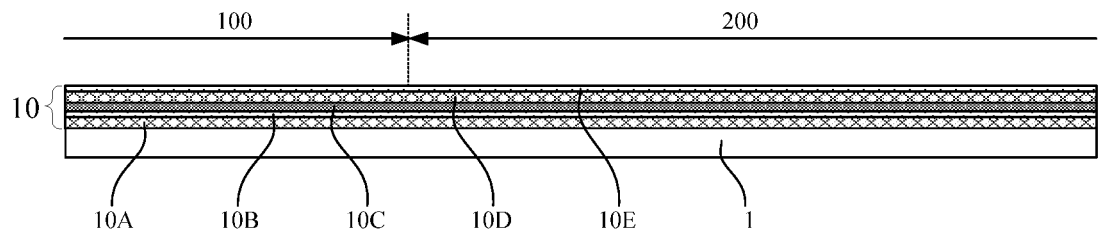
FIG. 12 is a schematic diagram of a structure after a base substrate is formed in some other exemplary embodiments.

(1) A flexible base substrate 10 is prepared on a glass carrier plate 1, as shown in FIG. 12.

This step may be the same as the step of forming a flexible base substrate 10 in the preparation process of the display substrate in FIG. 4 described above. The flexible base substrate 10 may include a first flexible layer 10A, a first barrier layer 10B, an amorphous silicon layer 10C, a second flexible layer 10D and a second barrier layer 10E which are sequentially stacked. Alternatively, the flexible base substrate 10 includes the second flexible layer 10D and the second barrier layer 10E that are stacked, but does not include the first flexible layer 10A, the first barrier layer 10B and the amorphous silicon layer 10C. After this process, both the display region 100 and the bonding region 200 include the flexible base substrate 10.

Figure 13:
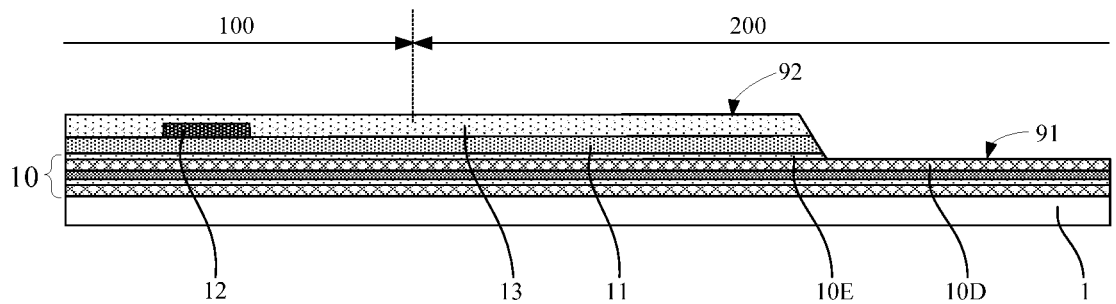
FIG. 13 is a schematic diagram of a structure after a second composite insulating layer and a second step structure are formed in some other exemplary embodiments.

(2) Some of the film layers of a drive structure layer of the display region 100 and a second composite insulating layer of the bonding region 200 are prepared on the flexible base substrate 10, and a second step structure is formed. In an exemplary implementation mode, as shown in FIG. 13, the preparation process of this step may include the followings:

A first insulating thin film and an active layer thin film are sequentially deposited on the flexible base substrate 10, and the active layer thin film is patterned by a patterning process to form a first insulating layer 11 overlying the entire flexible base substrate 10 and a pattern of an active layer disposed on the first insulating layer 11. The pattern of the active layer is formed in the display region and at least includes an active layer 12.

Subsequently, a second insulating thin film is deposited on the flexible base substrate 10 on which the aforementioned pattern is formed to form a second insulating layer 13. The second insulating layer 13 overlies the pattern of the active layer 12 in the display region 100 and is stacked on the first insulating layer 11 in the bonding region 200. After this process, the bonding region 200 includes the first insulating layer 11 and the second insulating layer 13 stacked on the flexible base substrate 10.

A groove is formed on the second barrier layer 10E, the first insulating layer 11 and the second insulating layer 13 in the bonding region 200, and the second barrier layer 10E, the first insulating layer 11 and the second insulating layer 13 in the groove are etched away to expose a surface of the second flexible layer 10D, thereby forming a second step structure. The second step structure includes a first step 91 formed by the first flexible layer 10A, the first barrier layer 10B, the amorphous silicon layer 10C and the second flexible layer 10D, and a second step 92 formed by the second barrier layer 10E, the first insulating layer 11 and the second insulating layer 13. A height of the second step 92 is greater than a height of the first step 91, and the second step 92 is disposed closer to the display region 100 than the first step 91. In an example where the flexible base substrate 10 uses a one-layer flexible layer structure, i.e. the flexible base substrate 10 includes the second flexible layer 10D and the second barrier layer 10E which are stacked, but does not include the first flexible layer 10A, the first barrier layer 10B and the amorphous silicon layer 10C, then the first step 91 includes the second flexible layer 10D, but does not include the first flexible layer 10A, the first barrier layer 10B and the amorphous silicon layer 10C.

(3) A first metal thin film is deposited on the flexible base substrate 10 on which the aforementioned patterns are formed, and the first metal thin film is patterned by a patterning process to simultaneously form a pattern of a first gate metal layer and a pattern of a first metal conductive layer in the display region 100 and the bonding region 200, respectively.

Figure 14:
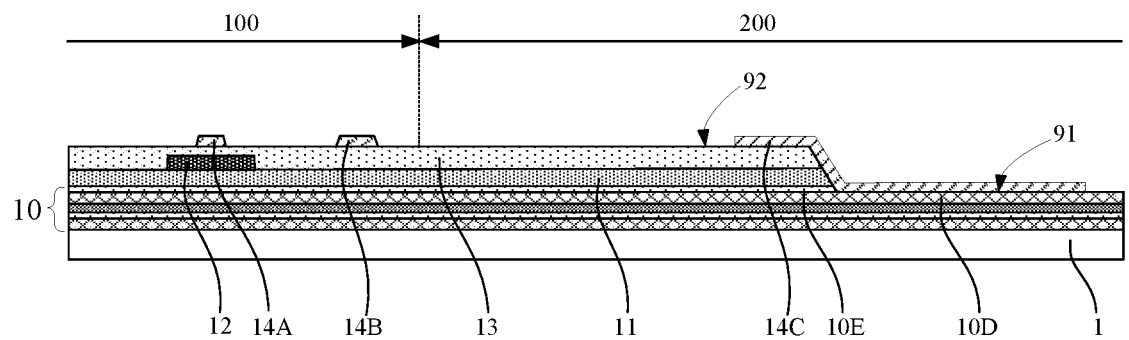
FIG. 14 is a schematic diagram of a structure after a first metal conductive layer is formed in some other exemplary embodiments.

The first gate metal layer at least includes a gate electrode 14A and a first capacitor electrode 14B. The first metal conductive layer includes a first connection lead 14C, wherein the first connection lead 14C is provided on the second step 92 and the first step 91 of the second step structure, as shown in FIG. 14.

Figure 15:
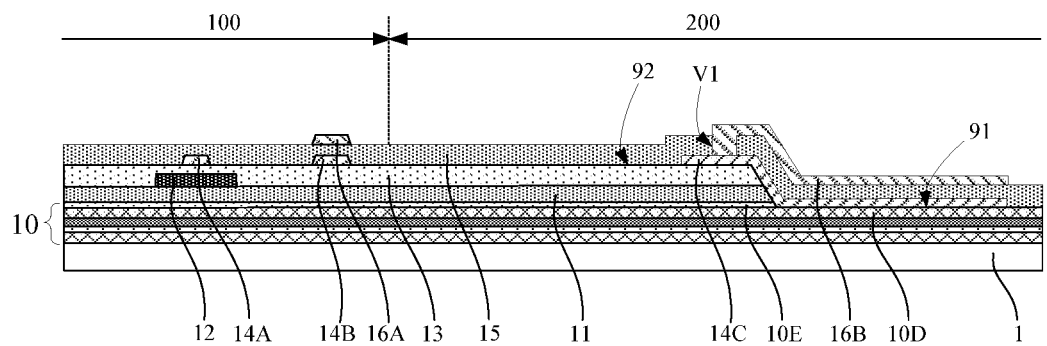
FIG. 15 is a schematic diagram of a structure after a third insulating layer and a second metal conductive layer are formed in some other exemplary embodiments.

(4) A third insulating thin film is deposited on the flexible base substrate 10 on which the aforementioned patterns are formed, and the third insulating thin film is patterned by a patterning process to form a third insulating layer 15 overlying the first gate metal layer and the first metal conductive layer. A first via hole V1 is formed in the third insulating layer 15 in the bonding region 200, and the third insulating thin film in the first via hole V1 is etched away to expose a surface of the first connection lead 14C on the second step 92, as shown in FIG. 15.

Subsequently, a second metal thin film is deposited on the flexible base substrate 10 on which the aforementioned patterns are formed, and the second metal thin film is patterned by a patterning process to form a pattern of a second gate metal layer disposed on the third insulating layer 15 in the display region 100, and a pattern of a second metal conductive layer disposed on the third insulating layer 15 in the bonding region 200. The pattern of the second gate metal layer at least includes a second capacitor electrode 16A, wherein a position of the second capacitor electrode 16A corresponds to a position of the first capacitor electrode 14B. The pattern of the second metal conductive layer at least includes a second connection lead 16B, wherein the second connection lead 16B is connected to the first connection lead 14C through a first via hole V1, as shown in FIG. 15.

(5) A fourth insulating thin film is deposited on the flexible base substrate 10 on which the aforementioned patterns are formed, and the fourth insulating thin film is patterned by a patterning process to form a fourth insulating layer 17 overlying the second gate metal layer and the second metal conductive layer. Two via holes are formed in the fourth insulating layer 17 in the display region 100. The fourth insulating thin film, the third insulating layer 15 and the second insulating layer 13 in the two via holes are etched away to expose a surface of the active layer 12. A second via hole V2 is formed in the fourth insulating layer 17 in the bonding region 200, and the fourth insulating thin film in the second via hole V2 is etched away to expose a surface of the second connection lead 16B, as shown in FIG. 16.

Subsequently, a third metal thin film is deposited on the flexible base substrate 10 on which the aforementioned patterns are formed, and the third metal thin film is patterned by a patterning process to form a pattern of a source-drain metal layer disposed on the fourth insulating layer 17 in the display region 100, and a pattern of a metal wiring layer disposed on the fourth insulating layer 17 in the bonding region 200. The pattern of the source-drain metal layer at least includes a source electrode 18A and a drain electrode 18B. The pattern of the metal wiring layer includes a signal lead 18C connected to the second connection lead 16B through the second via hole V2, as shown in FIG. 16.

Figure 16:
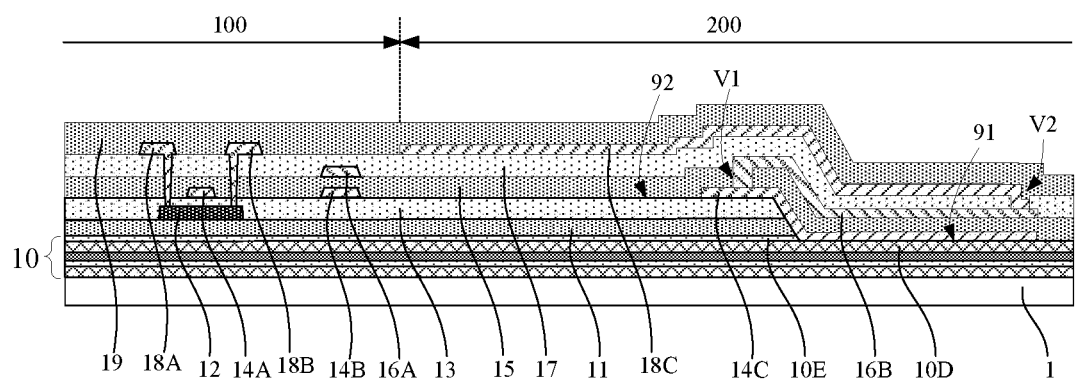
FIG. 16 is a schematic diagram of a structure after a fourth insulating layer, a metal wiring layer and a fifth insulating layer are formed in some other exemplary embodiments.

Subsequently, a fifth insulating thin film is deposited on the flexible base substrate 10 on which the aforementioned patterns are formed to form a pattern of a fifth insulating layer 19 overlying the source-drain metal layer and the metal wiring layer, as shown in FIG. 16.

At this point, a pattern of the drive structure layer has been prepared in the display region 100 of the flexible base substrate 10, and film layers of the bonding structure layer have been prepared in the bonding region 200, as shown in FIG. 16. The active layer 12, the gate electrode 14A, the source electrode 18A and the drain electrode 18B constitute a transistor which may be a drive transistor in a pixel drive circuit. The first capacitor electrode 14B and the second capacitor electrode 16A constitute a storage capacitor. The materials of all the film layers of the drive structure layer and the bonding structure layer may be the same as the materials of the film layers in the preparation process of the display substrate in FIG. 4 described above.

Figure 17:
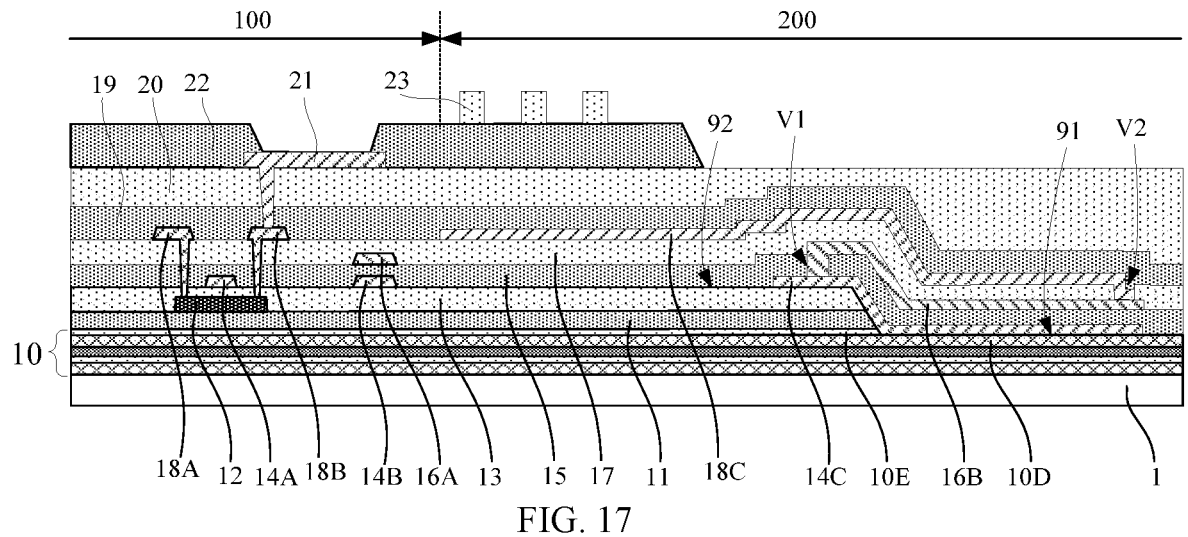
FIG. 17 is a schematic diagram of a structure after a planarization layer, an anode, a pixel definition layer and a post spacer are formed in some other exemplary embodiments.

(6) A planarization layer 20 is formed on the flexible base substrate 10 on which the aforementioned patterns are formed, an anode 21 of a light emitting structure layer and a pixel definition layer 22 are formed in the display region 100, and a post spacer 23 is formed in the bonding region 200, as shown in FIG. 17. The preparation process of this step may be the same as the corresponding step in the preparation process of the display substrate in FIG. 4 described above.

Figure 18:
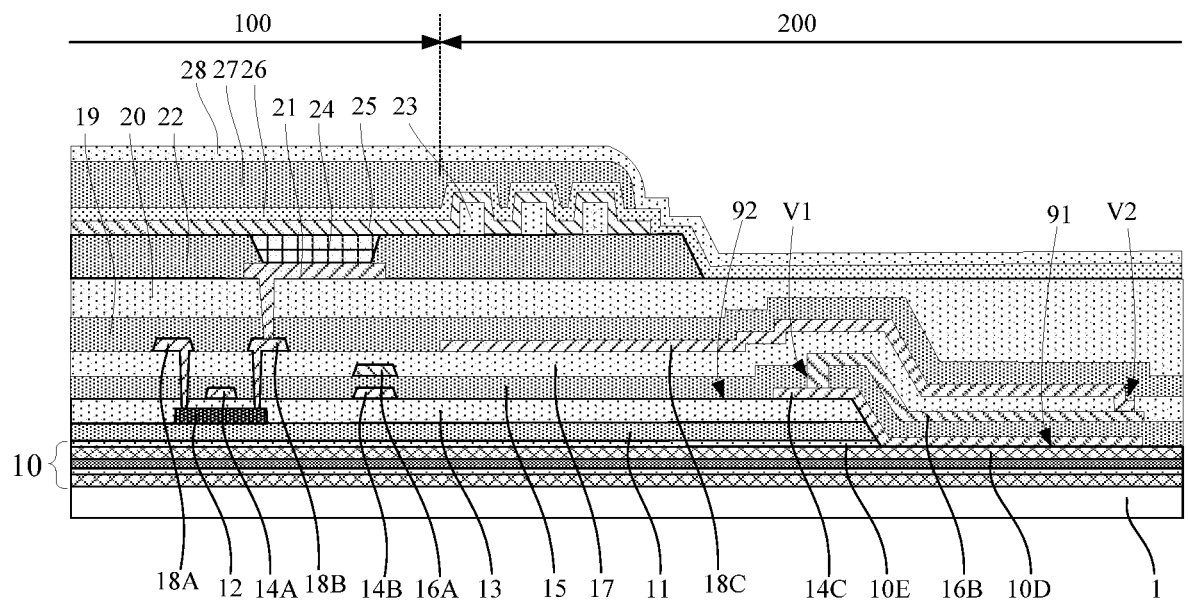
FIG. 18 is a schematic diagram of a structure after an organic light emitting layer, a cathode and an encapsulation structure layer are formed in some other exemplary embodiments.

(7) An organic light emitting layer 24, a cathode 25, and an encapsulation structure layer are formed on the flexible base substrate 10 on which the aforementioned patterns are formed, and the encapsulation structure layer includes a first inorganic encapsulation layer 26, an organic encapsulation layer 27 and a second inorganic encapsulation layer 28 which are stacked, as shown in FIG. 18. The preparation process of this step may be the same as the corresponding step in the preparation process of the display substrate in FIG. 4 described above.

Figure 19:
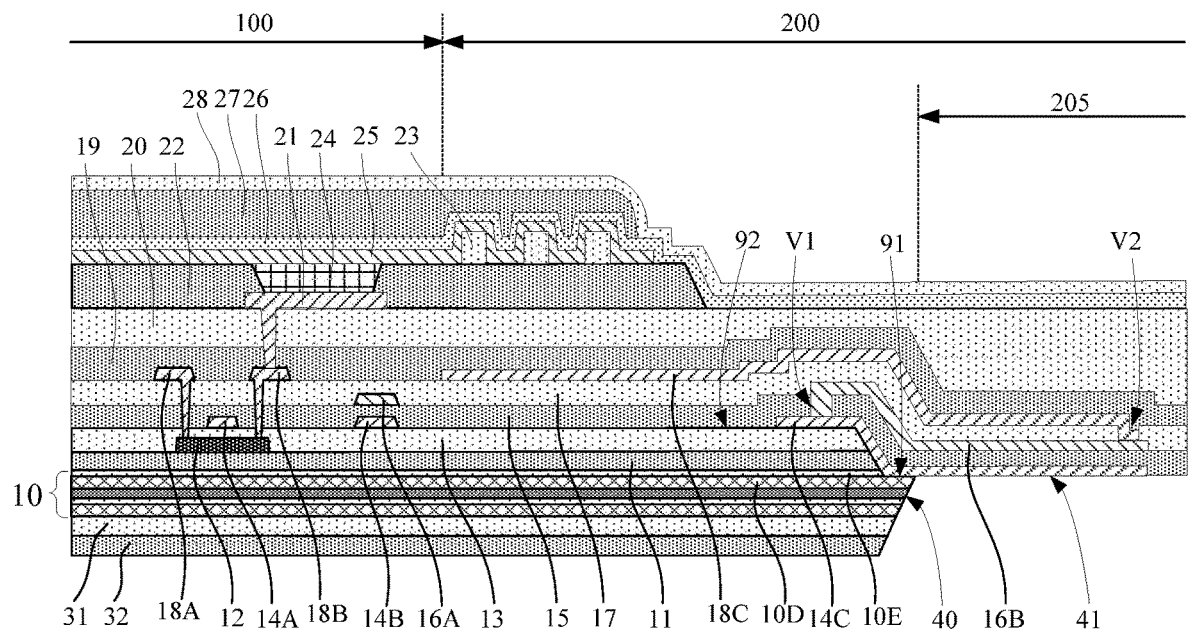
FIG. 19 is a schematic diagram of a structure after an auxiliary film layer is attached to and an opening is formed on a base substrate in some other exemplary embodiments.

(8) The flexible base substrate 10 on which the aforementioned film layers are formed is peeled off from the glass carrier plate 1, and an auxiliary film layer is attached to a surface of the flexible base substrate 10 facing away from the display side. As an example, the auxiliary film layer may include a protective film 31, a heat dissipation film 32, and the like which are stacked. An opening 40 is formed in the flexible base substrate 10 and the auxiliary film layer at a position corresponding to the first step 91, the opening 40 exposes the first connection lead 14C on the first step 91, wherein a portion of the first connection lead 14C exposed by the opening 40 is provided with a bonding pin 41. An area in the bonding region 200 where the bonding pin 41 is formed is a bonding pin area 205, and the bonding pin 41 in the bonding pin area 205 may be bonding-connected to an external circuit board, as shown in FIG. 19.

(9) The display substrate is bonding-connected to a drive IC and an FPC.

In some exemplary embodiments, as shown in FIG. 11, a drive IC may be bonded to the display substrate using a COF. The COF 60 includes a thin film circuit board body and a drive IC 61 fixed on the thin film circuit board body. One end of the thin film circuit board body of the COF 60 is bonding-connected to a bonding pin 41 of the display substrate, and the other end of the thin film circuit board body of the COF 60 is bonding-connected to an FPC 70. Both the COF 60 and the FPC 70 may be fixed to a surface of the display substrate facing away from the display side by an adhesive. The COF 60 receives a signal transmitted by the FPC 70 and transmits an output signal to the display substrate to drive the display substrate for display. In other examples, the bonding pin 41 may be directly bonding-connected to the drive IC or the FPC, and the drive IC or the FPC may be directly bonded to the back side of the display substrate.

Based on the preceding contents, an embodiment of the present disclosure provides a method for preparing a display substrate, the display substrate including a display region and a bonding region located on a side of the display region, wherein the method includes:

forming a composite insulating layer on a base substrate of the bonding region, the base substrate and the composite insulating layer forming a step structure in which heights of steps decrease sequentially in a direction away from the display region and in which a first step having the smallest height is formed by the base substrate;

forming a signal connection line in the bonding region, at least a portion of the signal connection line being disposed on the step structure and located on the first step; and forming an opening on the base substrate at the first step, the opening exposing the signal connection line, and a portion of the signal connection line exposed by the opening forming a bonding pin.

In some exemplary embodiments, the forming the signal connection line in the bonding region includes:

forming a first metal conductive layer on the composite insulating layer, the first metal conductive layer including a first connection lead, the first connection lead being disposed on the step structure and located on the first step;

forming a second metal conductive layer on a side of the first metal conductive layer away from the base substrate, the second metal conductive layer including a second connection lead, the second connection lead being connected with the first connection lead through a first via hole;

forming a metal wiring layer on a side of the second metal conductive layer away from the base substrate, the metal wiring layer including a signal lead connected with a signal line in the display region, the signal lead being connected with the second connection lead through a second via hole, and the signal connection line including the signal lead, the second connection lead and the first connection lead;

the forming the opening on the base substrate at the first step, the opening exposing the signal connection line, and the portion of the signal connection line exposed by the opening forming the bonding pin includes: forming an opening on the base substrate at the first step, the opening exposing the first connection lead, a portion of the first connection lead exposed by the opening forming a bonding pin.

An embodiment of the present disclosure further provides a display device, including the display substrate described in any of the aforementioned embodiments. In some exemplary embodiments, as shown in FIG. 4 and FIG. 11, the display device further includes a Chip On Film 60 bonding-connected to the bonding pin 41, and a flexible printed circuit 70 bonding-connected to the Chip On Film 60, and a drive IC 61 is bonding-connected to the Chip On Film 60. In other embodiments, the display device further includes a flexible printed circuit (FPC) and a drive IC bonding-connected to the bonding region 200, and the flexible printed circuit or the drive IC is bonding-connected to the bonding pin 41. The drive IC receives a signal transmitted by the flexible printed circuit 70 and transmits an output signal to the display substrate to drive the display substrate for display. The display device in an embodiment of the present disclosure may be any product or component with a display function, such as a mobile phone, a tablet computer, a television, a display, a laptop computer, a digital photo frame, or a navigator.

In the description herein, orientation or positional relations indicated by terms "up", "down", "left", "right", "top", "inside", "outside", "axial direction", "four corners" and the like are based on the orientation or positional relations shown in the drawings, which are only simplified description for facilitating describing the embodiments of the present disclosure, rather than indicating or implying that the structures referred to have a specific orientation, and are constructed and operated in a specific orientation, and thus cannot be interpreted as a limitation on the present disclosure.

In the description herein, unless otherwise specified and defined explicitly, the terms "connection", "fixed connection", "installation" and "assembly" should be broadly understood, which, for example, may be a fixed connection, a detachable connection, or an integral connection; and the terms "installation", "connection" and "fixed connection" may be a direct connection, or an indirect connection through an intermediary, or an internal connection between two elements. Those of ordinary skills in the art may understand the meanings of the above terms in the specification.

The invention claimed is:

1. A display substrate, comprising a display region and a bonding region located on a side of the display region, wherein the bonding region comprises a bonding structure layer disposed on a base substrate, the bonding structure layer comprises a composite insulating layer disposed on the base substrate, the bonding region further comprises a step structure formed by the base substrate and the composite insulating layer, heights of steps in the step structure decrease sequentially in a direction away from the display region, and the base substrate is provided with a first step having a smallest height in the step structure; and the bonding structure layer further comprises a signal connection line, at least a portion of the signal connection line is disposed on the step structure and located on the first step, the base substrate at the first step is provided with an opening exposing the signal connection line, and a portion of the signal connection line exposed by the opening is provided with a bonding pin.

2. The display substrate according to claim 1, wherein the bonding structure layer further comprises a metal wiring layer disposed on the composite insulating layer, the metal wiring layer comprises a signal lead connected to a signal line in the display region;

the signal connection line comprises the signal lead, the signal lead is disposed on the step structure and located on the first step, and a portion of the signal lead exposed by the opening is provided with the bonding pin.

3. The display substrate according to claim 2, wherein the base substrate comprises a flexible layer and a barrier layer which are stacked, and the composite insulating layer comprises a first insulating layer, a second insulating layer, a third insulating layer and a fourth insulating layer which are stacked on the barrier layer;

the step structure comprises the first step formed by the flexible layer, a second step formed by the barrier layer and the first insulating layer, and a third step formed by the second insulating layer, the third insulating layer and the fourth insulating layer, heights of the first step, the second step and the third step increase sequentially; and the signal lead is disposed on the third step, the second step and the first step.

4. The display substrate according to claim 2, wherein the display region comprises a drive structure layer and a light emitting structure layer disposed on the drive structure layer, the drive structure layer is provided with a pixel drive circuit, the drive structure layer comprises a source-drain metal layer comprising a source electrode and a drain electrode, and the metal wiring layer is disposed in a same layer as the source-drain metal layer.

5. The display substrate according to claim 1, wherein the bonding structure layer further comprises a first metal conductive layer disposed on the composite insulating layer, and a metal wiring layer disposed on a side of the first metal conductive layer away from the base substrate, the metal wiring layer comprises a signal lead connected to a signal line in the display region, and the first metal conductive layer comprises a first connection lead connected to the signal lead; and the signal connection line comprises the signal lead and the first connection lead, the first connection lead is disposed on the step structure and located on the first step, and a portion of the first connection lead exposed by the opening is provided with the bonding pin.

6. The display substrate according to claim 5, wherein an end of the signal lead away from the display region is connected to an end of the first connection lead away from the display region through a via hole.

7. The display substrate according to claim 5, wherein the bonding structure layer further comprises a second metal conductive layer arranged between the first metal conductive layer and the metal wiring layer, the second metal conductive layer comprises a second connection lead, the second connection lead is connected to the first connection lead through a first via hole, and the signal lead is connected to the second connection lead through a second via hole.

8. The display substrate according to claim 7, wherein the first via hole is provided closer to the display region than the second via hole, and the opening is provided further away from the display region than the first via hole.

9. The display substrate according to claim 7, wherein the base substrate comprises a flexible layer and a barrier layer which are stacked, the composite insulating layer comprises a first insulating layer and a second insulating layer which are sequentially stacked on the barrier layer;

the step structure comprises the first step formed by the flexible layer, and a second step formed by the barrier layer, the first insulating layer and the second insulating layer, the second step is disposed closer to the display region than the first step; and the first connection lead is provided on the second step and the first step.

10. The display substrate according to claim 9, wherein the bonding structure layer further comprises a third insulating layer overlying the first metal conductive layer, the second metal conductive layer is disposed on the third insulating layer, the bonding structure layer further comprises a fourth insulating layer overlying the second metal conductive layer, the metal wiring layer is disposed on the fourth insulating layer, the third insulating layer is provided with the first via hole, and the fourth insulating layer is provided with the second via hole.

11. The display substrate according to claim 10, wherein the display region comprises a drive structure layer and a light emitting structure layer disposed on the drive structure layer, the drive structure layer is provided with a pixel drive circuit, and the drive structure layer comprises: a first insulating layer disposed on the base substrate, an active layer disposed on the first insulating layer, a second insulating layer overlying the active layer, a first gate metal layer disposed on the second insulating layer, a third insulating layer overlying the first gate metal layer, a second gate metal layer disposed on the third insulating layer, a fourth insulating layer overlying the second gate metal layer, and a source-drain metal layer disposed on the fourth insulating layer; and the first metal conductive layer is disposed in a same layer as the first gate metal layer, the second metal conductive layer is disposed in a same layer as the second gate metal layer, and the metal wiring layer is disposed in a same layer as the source-drain metal layer.

12. The display substrate according to claim 9, wherein the second connection lead is connected to the first connection lead on the second step through the first via hole.

13. A display device, comprising the display substrate according to claim 1.

14. The display device according to claim 13, further comprising a chip on film which is in bonding connection with the bonding pin, and a flexible printed circuit bonding-connected to the Chip On Film.

15. A method for preparing a display substrate, the display substrate comprising a display region and a bonding region located on a side of the display region, the method comprising:

forming a composite insulating layer on a base substrate of the bonding region, wherein the base substrate and the composite insulating layer form a step structure in which heights of steps decrease sequentially in a direction away from the display region and in which the base substrate is provided with a first step having a smallest height;

forming a signal connection line in the bonding region, wherein at least a portion of the signal connection line is disposed on the step structure and located on the first step; and forming an opening on the base substrate at the first step, the opening exposing the signal connection line, and a portion of the signal connection line exposed by the opening forming a bonding pin.

16. The method for preparing the display substrate according to claim 15, wherein forming the signal connection line in the bonding region comprises:

forming a first metal conductive layer on the composite insulating layer, wherein the first metal conductive layer comprises a first connection lead, and the first connection lead is disposed on the step structure and located on the first step;

forming a second metal conductive layer on a side of the first metal conductive layer away from the base substrate, wherein the second metal conductive layer comprises a second connection lead, and the second connection lead is connected with the first connection lead through a first via hole;

forming a metal wiring layer on a side of the second metal conductive layer away from the base substrate, wherein the metal wiring layer comprises a signal lead connected with a signal line in the display region, the signal lead is connected with the second connection lead through a second via hole, and the signal connection line comprises the signal lead, the second connection lead and the first connection lead; and the forming the opening on the base substrate at the first step, the opening exposing the signal connection line, and the portion of the signal connection line exposed by the opening forming the bonding pin comprises: forming the opening on the base substrate at the first step, wherein the opening exposes the first connection lead, a portion of the first connection lead exposed by the opening is provided with the bonding pin.

* * * * *